United States Patent
Kousaki et al.

(10) Patent No.: US 8,079,012 B2
(45) Date of Patent: Dec. 13, 2011

(54) METHOD FOR ACQUIRING BASIC CHARACTERISTIC OF SIMULTANEOUS SWITCHING NOISE IN METHOD FOR ESTIMATING SIMULTANEOUS SWITCHING NOISE ON SEMICONDUCTOR DEVICE

(75) Inventors: Yasuo Kousaki, Kawasaki (JP); Shinichiro Uekusa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 551 days.

(21) Appl. No.: 12/199,918

(22) Filed: Aug. 28, 2008

(65) Prior Publication Data
US 2009/0150840 A1    Jun. 11, 2009

(30) Foreign Application Priority Data
Dec. 6, 2007    (JP) .................................. 2007-316449

(51) Int. Cl.
   *G06F 17/50*    (2006.01)
(52) U.S. Cl. ........................... 716/137; 716/115; 716/138
(58) Field of Classification Search .................. 716/115, 716/132–133, 137–138
See application file for complete search history.

(56) References Cited

U.S. PATENT DOCUMENTS

| | | | |
|---|---|---|---|
| 6,144,176 A | 11/2000 | Quinlan | |
| 7,472,367 B1* | 12/2008 | Xie et al. | 716/132 |
| 7,698,670 B2* | 4/2010 | Masumura | 716/106 |
| 2004/0010762 A1* | 1/2004 | Habitz | 716/115 |
| 2007/0162879 A1* | 7/2007 | Tiwari | 716/115 |
| 2008/0027662 A1* | 1/2008 | Kouzaki et al. | 702/57 |

FOREIGN PATENT DOCUMENTS

| | | |
|---|---|---|
| JP | 10-127089 | 5/1998 |
| JP | 2004-205095 | 7/2004 |

* cited by examiner

*Primary Examiner* — Stacy Whitmore
(74) *Attorney, Agent, or Firm* — Fujitsu Patent Center

(57) ABSTRACT

In an initial stage of device design, a circuit analysis control unit of an evaluation board stores SSO noise basic characteristic data actually measured by the evaluation board in an SSO noise basic characteristic data storage unit, and an SSO noise calculation unit calculates a rough amount of SSO noise on the basis of the SSO noise basic characteristic data. After a noise check is OR, the design proceeds, and a PCB parameter is determined, a circuit analysis control unit acquires the SSO noise basic characteristic data according to actual device PCB design information, and corrects the SSO noise basic characteristic data in the SSO noise basic characteristic data storage unit. Then, the SSO noise calculation unit performs a detailed analysis of an amount of SSO noise using the corrected SSO noise basic characteristic data.

4 Claims, 12 Drawing Sheets

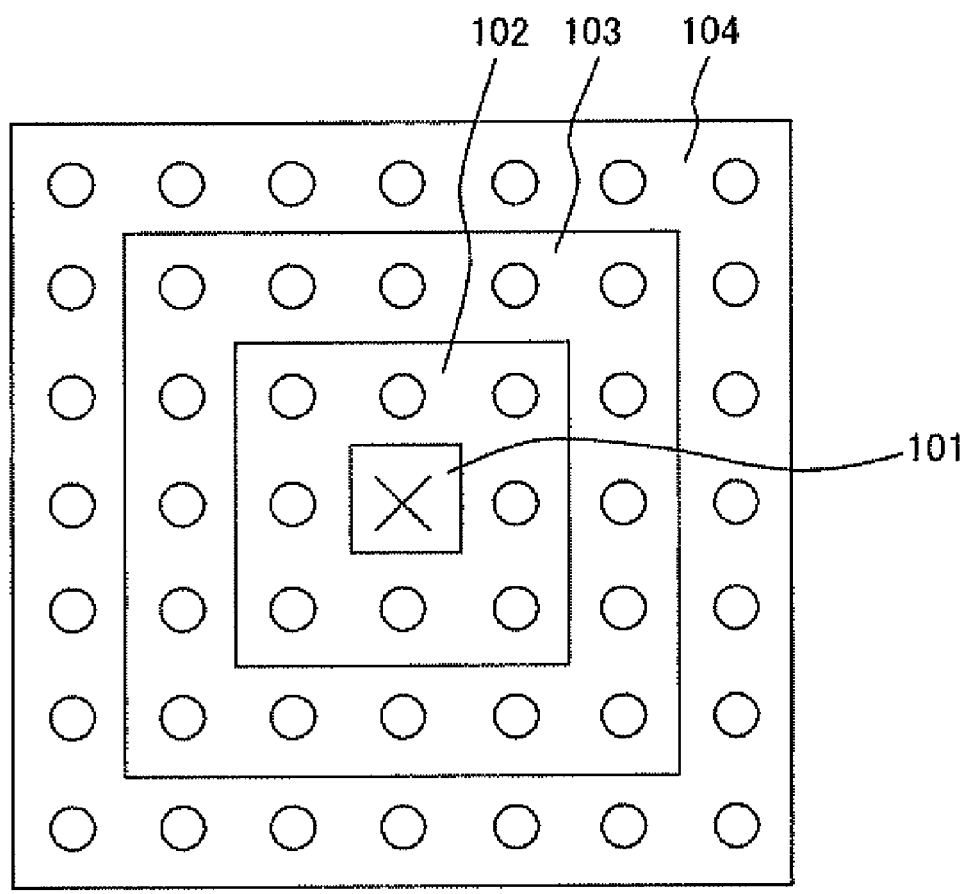
F I G. 1

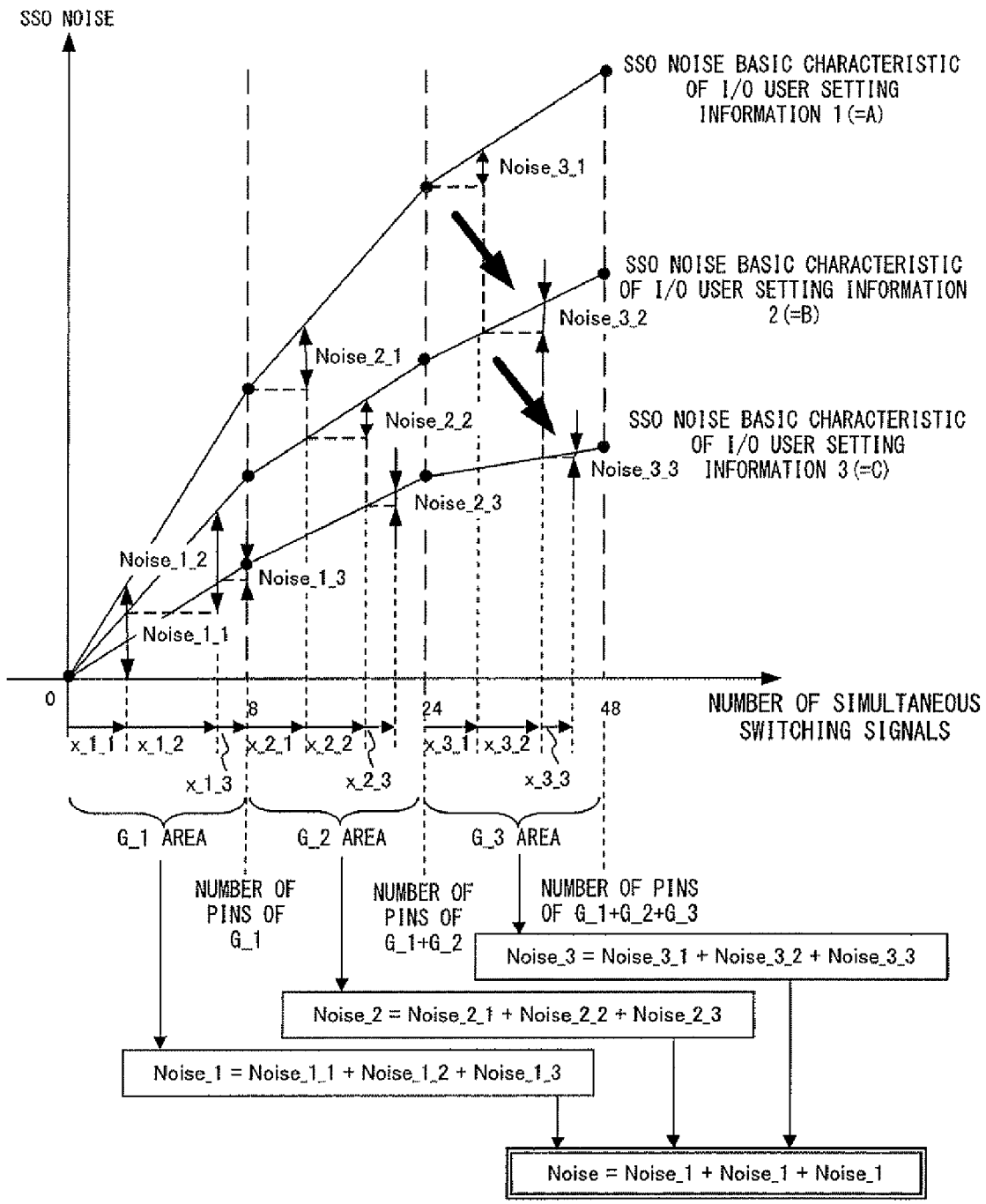
F I G. 4

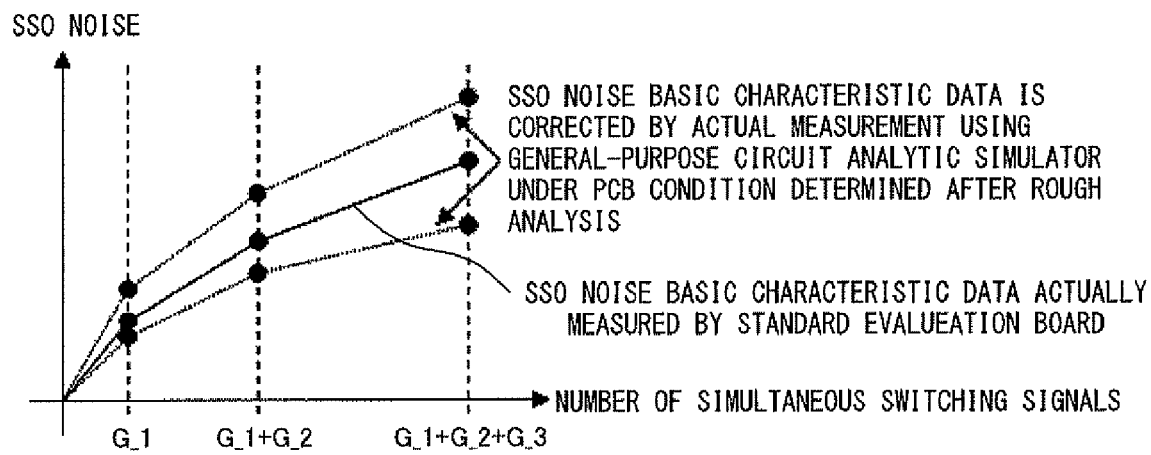
F I G. 5

| LSI IDENTI-FIER | PIN IDENTI-FIER | ROW | COLUMN | I/O USER SETTING INFORMATION | ... |
|---|---|---|---|---|---|
| | | 1 | 1 | A | ... |
| | | 1 | 2 | B | |
| : | : | : | : | : | |

FIG. 8

| I/O USER SETTING INFORMATION | NUMBER OF SSO | AMOUNT OF SSO NOISE (mV) | SUFFIX (REFERENCE) |
|---|---|---|---|
| A (GND SIDE OF SET VALUE A) | 1 | 50 | |
| | 8 | 380 | ACTUAL NOISE_1_1 |
| | 24 | 990 | ACTUAL NOISE_2_1 |
| | 48 | 1455 | ACTUAL NOISE_3_1 |
| A (VCC SIDE OF SET VALUE A) | 1 | 55 | ACTUAL NOISE_1_1' |
| | 8 | 403 | ACTUAL NOISE_2_1' |
| | 24 | 1012 | ACTUAL NOISE_3_1' |
| | 48 | 1582 | |
| B (GND SIDE OF SET VALUE B) | 1 | 40 | |
| | 8 | 305 | ACTUAL NOISE_1_2 |
| | 24 | 786 | ACTUAL NOISE_2_2 |
| | 48 | 1245 | ACTUAL NOISE_3_2 |
| B (VCC SIDE OF SET VALUE B) | 1 | 44 | |
| | 8 | 368 | ACTUAL NOISE_1_2' |
| | 24 | 951 | ACTUAL NOISE_2_2' |
| | 48 | 1403 | ACTUAL NOISE_3_2' |
| C (GND SIDE OF SET VALUE C) | 1 | 30 | |
| | 8 | 214 | ACTUAL NOISE_1_3 |
| | 24 | 524 | ACTUAL NOISE_2_3 |
| | 48 | 853 | ACTUAL NOISE_3_3 |
| C (VCC SIDE OF SET VALUE C) | 1 | 33 | |
| | 8 | 234 | ACTUAL NOISE_1_3' |
| | 24 | 607 | ACTUAL NOISE_2_3' |
| | 48 | 911 | ACTUAL NOISE_3_3' |
| ... | | | |
| X (GND SIDE OF SET VALUE X) | 1 | 5 | |
| | 8 | 29 | |
| | 24 | 68 | |
| | 48 | 112 | |
| X (VCC SIDE OF SET VALUE X) | 1 | 5.5 | |
| | 8 | 31 | |
| | 24 | 83 | |
| | 48 | 142 | |

METHOD FOR ACQUIRING BASIC CHARACTERISTIC OF SIMULTANEOUS SWITCHING NOISE IN METHOD FOR ESTIMATING SIMULTANEOUS SWITCHING NOISE ON SEMICONDUCTOR DEVICE

BACKGROUND OF THE INVENTION

1. Field of the Invention

The present invention relates to a technique of estimating simultaneous switching noise generated by simultaneously operating input/output signals of a plurality of pins in a semiconductor device, and more specifically to a technique of acquiring the basic characteristics of the noise.

2. Description of the Prior Art

Conventionally, the power supply oscillation between the ground of a device package or the pin of a power supply, and the ground of an intra-device die or the reference level of a power supply is referred to a ground bounce or a power supply sag, and is one of main factors of erroneous switching.

Recently, an FPGA (field programmable gate array) attracts attention as a semiconductor device in which the pin arrangement, circuit configuration, etc. can be arbitrarily set by a user. With an increasing number of I/O pins of the FPGA and a higher speed of an interface signal, a number output pins simultaneously operating cause an outstanding ground bounce or power supply sag. Therefore, these events are generally referred to as simultaneous operation signal noise (SSN (simultaneous switching noise) or SSO noise (simultaneous switch output noise)).

The amount of SSO noise depends on the pin arrangement of the FPGA. Therefore, in the designing step of a PCB (printed circuit board) loaded with the FPGA, it is necessary to estimate the amount of SSO noise generated on the basis of the pin arrangement of the FPGA to appropriate operating an FPGA device.

As a conventional technology of performing a simulation of SSO noise, general-purpose circuit analytic simulator software etc. referred to as a SPICE (simulation program with integrated circuit emphasis) developed by an integrated circuit group of the Electronics Research Laboratory and the Department of Electrical Engineering Computer Science (EECS) of University of California, Barkley is well known.

In addition the following patent documents 1, 2, etc. are also known as related art.

However, a simulator such as a SPICE can perform a relatively correct simulation of the SSO noise, but has the problem that the simulation takes an enormously long time.

[Patent Document 1] Japanese Published Patent Application No. H10-127089

[Patent Document 2] Japanese Published Patent Application No. 2004-205095

SUMMARY OF THE INVENTION

The present invention aims at estimating within a short time and with high accuracy the simultaneous switching noise generated by an input/output signal input or output to and from a plurality of pins in a semiconductor device.

An aspect of the present invention is realized as a simultaneous switching noise estimating method or program for estimating simultaneous switching noise based on simultaneous operations of input/output signals of a plurality of pins that can be set according to plural pieces of user setting information in a semiconductor device.

In the first step, simultaneous switching noise basic characteristic data indicating for each piece of user setting information the function relationship between the number of simultaneous switching signals as the number of simultaneously operating pins and the amount of simultaneous switching noise is calculated when the semiconductor device is loaded into a predetermined standard or evaluation printed circuit board and operated.

In the second step, the number of simultaneous switching signals is calculated for each piece of user setting information about an area near each pin to be processed using each pin of the semiconductor device as a pin to be processed, and the amount of simultaneous switching noise is calculated for each pin to be processed on the basis of the calculation result and the simultaneous switching noise basic characteristic data calculated in the first step.

In the third step, when the pin arrangement of a semiconductor device and the configuration of a printed circuit board into which the semiconductor device are provided are designed so that the amount of simultaneous switching noise for each pin to be processed calculated in the second step can be within a predetermined allowable range, the simultaneous switching noise basic characteristic data is re-calculated and corrected.

In the fourth step, the number of simultaneous switching signals is calculated for each piece of user setting information on an area near each pin to be processed using each pin of the semiconductor device as a pin to be processed, and the amount of simultaneous switching noise for each pin to be processed is re-calculated on the basis of a calculation result and the simultaneous switching noise basic characteristic data corrected in the third step.

In the fifth step, the design of the configuration of the printed circuit board for which the pin arrangement of the semiconductor device is performed and the semiconductor device is loaded is corrected so that the amount of simultaneous switching noise for each pin to be processed re-calculated in the fourth step can be within a predetermined allowable range.

With the configuration according to the aspect of the present invention, in the second or fourth step, the area near each pin to be processed is divided into a plurality of groups on the basis of the distance from each pin to be processed, the number of simultaneous switching signals is calculated for each group according to each piece of user setting information, the amount of simultaneous switching noise is calculated on the basis of the result of calculating the number of simultaneous switching signals and the simultaneous switching noise basic characteristic data, results of the calculation are added up for all groups, the amount of simultaneous switching noise for each pin to be processed is calculated, the simultaneous switching noise basic characteristic data indicates the function relationship between the number of simultaneous switching signals and the amount of simultaneous switching noise for each group and each piece of user setting information.

With the above-mentioned configuration according to the aspect of the present invention, the simultaneous switching noise basic characteristic data is corrected on the basis of the actual design of a printed circuit board after roughly analyzing the amount of simultaneous switching noise, and the detailed analysis is performed on the amount of simultaneous switching noise, thereby correctly estimating the simultaneous switching noise. A device configured by a semiconductor device having the pin arrangement determined on the basis of the estimation and a printed circuit board in which the device is implemented can appropriately prevents a malfunction caused by the simultaneous switching noise.

BRIEF DESCRIPTION OF THE DRAWINGS

FIG. 1 shows an example of grouping a pin arrangement near the pin to be processed on the FPGA chip;

FIG. 4 is an explanatory view showing the principle of calculating the amount of SSO noise;

FIG. 5 is an explanatory view of correcting the basic characteristic of simultaneous switching noise on the basis of a circuit analysis simulation;

FIG. 8 shows an example of the data structure of the pin information storage unit;

FIG. 9 shows an example of a table structure of the SSO noise basic characteristic data storage unit;

DESCRIPTION OF THE PREFERRED EMBODIMENTS

Figure 2:
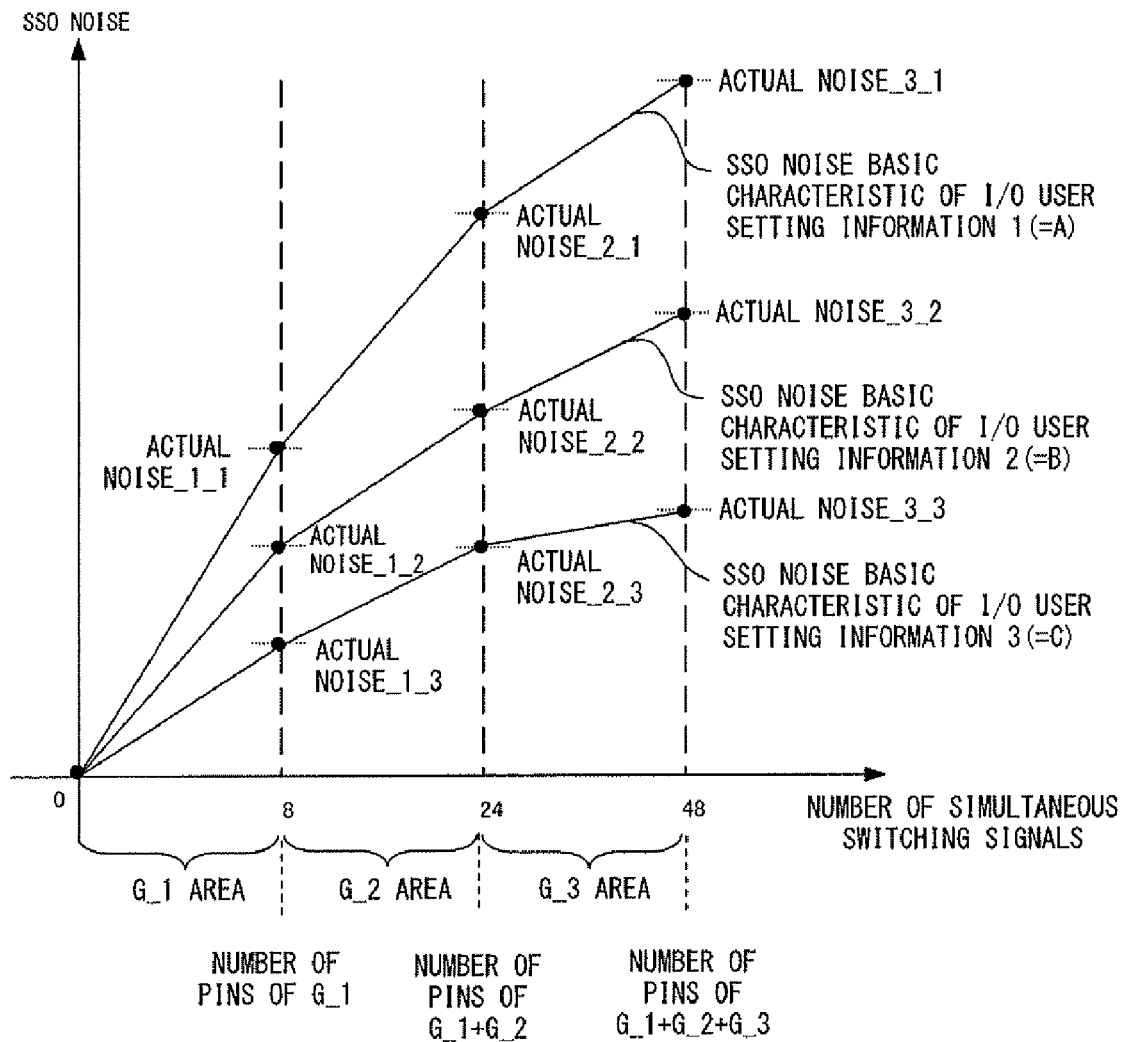
FIG. 2 is an explanatory view of the SSO noise basic characteristic.

The best mode for carrying out the present invention are described below with reference to the attached drawings.

Basic Principle of the Embodiments of the Present Invention

Before describing the practical configuration and operation according to an embodiment of the present invention, the basic principle of the embodiment of the present invention is first described below.

When the SSO noise of a semiconductor device of an FPGA etc. is evaluated, it is necessary to estimate the noise superposed on a signal of a pin to be processed as SSO noise for each pin (hereinafter referred to as a "pin to be processed") of the signal input/output pin (I/O pin, and hereinafter referred to simply as a "pin") of the semiconductor device when a signal of the pin surrounding the pin to be processed are simultaneously operated. If the amount of SSO noise of all pins to be processed falls within a predetermined value, it can be determined that the designed pin arrangement is appropriate.

To estimate the SSO noise of one pin to be processed, the pin arrangement around the pin to be processed and the user setting information about the input/output signal (hereinafter referred to as "I/O user setting information") are important elements. The I/O user setting information includes the standard (LVTTL, LVCMOS, HSTL, etc.) of the input/output signal, the output current value (12 mA, 8 mA, 4 mA, etc.), the through rate (FAST/SLOW), etc.

In estimating the SSO noise of the I/O pin of a semiconductor according to an embodiment of the present invention, a plurality of pins located in an area near a pin to be processed are classified into a plurality of groups depending on the size of the combined inductance of the return current to the pin to be processed, that is, the distance to the pin to be processed.

According to the embodiment of the present invention, the classification is performed with the distance to the pin to be processed taken into account as shown in, for example, FIG. 1. That is, for a pin to be processed 101 shown in FIG. 1, eight pins in an area 102 belong to group 1 (G_1), 16 pins in an area 103 belong to group 2 (G_2), and 24 pins in an area 104 belong to group 3 (G_3).

Based on the above-mentioned classification, the SSO noise on the pins to be processed is measured using the general-purpose circuit analytic simulator software. The SSO noise basic characteristic as indicated by the plots [•] and the lines interpolating them as shown in FIG. 2 can be obtained.

In FIG. 2, Noise_i_j belongs to group i (G_i), and shows the amount of SSO noise of the pin having the I/O user setting information j.

Actual Noise_1_1 refers to an actual simulation value of the amount of SSO noise when all of 8 pins belonging to the group 1 (G_1) have the signal characteristic of the I/O user setting information 1.

Actual Noise_2_1 refers to an actual simulation value of the amount of SSO noise when all of 24 pins in the group 2 (G_2), that is, 8 pins belonging to G_1 and 16 pins belonging to G_2 have the signal characteristic of the I/O user setting information 1.

Actual Noise_3_1 refers to an actual simulation value of the amount of SSO noise when all of 48 pins in the group 3 (G_3), that is, 8 pins belonging to G_1, 16 pins belonging to G_2, and 24 pins belonging to G_3 have the signal characteristic of the I/O user setting information 1.

Similarly, Actual Noise_1_2 refers to an actual simulation value of the amount of SSO noise when all of 8 pins belonging to G_1 have the signal characteristic of the I/O user setting information 2. Actual Noise_2_2 refers to an actual simulation value of the amount of SSO noise when all of 24 ping in G_2 have the signal characteristic of the I/O user setting information 2. Actual Noise_3_2 refers to an actual simulation value o the amount of SSO noise when all of 48 pins in G_3 have the signal characteristic of the I/O user setting information 2.

Similarly, actual Noise_1_3 refers to an actual simulation value of the amount of SSO noise when all of 8 pins belonging to G_1 have the signal characteristic of the I/O user setting information 3. Actual Noise_2_3 refers to an actual simulation value of the amount of SSO noise when all of 24 pins in G_2 have the signal characteristic of the I/O user setting information 3. Actual Noise_3_3 refers to an actual simulation value of the amount of SSO noise when all of 48 pins in G_3 have the signal characteristic of the I/O user setting information 3.

As known from FIGS. 1 and 2, when the I/O user setting information is different, the signal characteristic of each pin is also different, thereby obtaining a different amount of SSO noise. If a group is different, the distance to the pin to be processed is largely different. Therefore, an amount of change (=tilt of basic characteristic) of the amount of SSO noise with respect to the number of simultaneous switching signals.

However, when a type of I/O user setting information is regarded, a pin in the same group has almost an equal distance (coupled inductance value) to a pin to be processed. Therefore, it can be assumed that the increase rate of the amount of SSO noise is almost constant when the number of pins having the I/O user setting information in the same group increases. That is, the SSO noise basic characteristic for the I/O user setting information in a group can be approximated by a simple line as shown in FIG. 2.

On the basis of the characteristic, assuming that the number of pins belonging to the group i (G_i) and having the I/O user setting information j is x_i_j, the amount of SSO noise Noise_i_j caused by x_i_j pins can be easily calculated by linear interpolation from the actual value of the amount of noise=actual Noise_i_j when all pins belonging to G_i have the I/O user setting information j and the actual value of the amount of noise actual Noise_i_1_j when there are no pins having the I/O user setting information j in G_i and all pins in the group i-1 or inside have the I/O user setting information j.

When the SSO noise basic characteristic cannot be approximated by a simple line, the value obtained by multiplying x_i_j by the differential coefficient (tilt of the straight line in case of linear interpolation) in x_i_j of the SSO noise basic characteristic can be calculated as the amount of SSO noise Noise_i_j.

Figure 3:
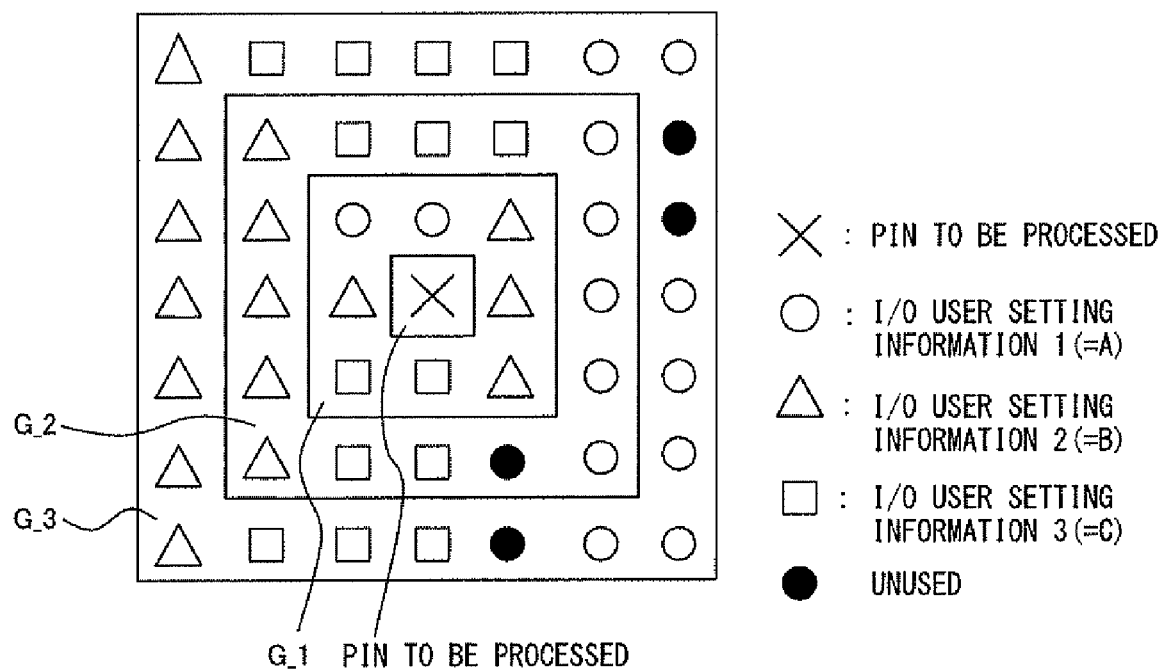
FIG. 3 shows an example of the pin arrangement for each I/O user setting information near a pin to be processed on the FPGA chip.

Actually, as shown in FIG. 3, each of the groups G_1, G_2, and G_3 contains pins having different I/O user setting information 1 to 3 etc. Therefore, the total amount of SSO noise on one pin to be processed can be obtained by first calculating an intra-group total Noise_i of the amount of SSO noise of the amount of SSO of the amount of SSO noise Noise_i_1 through Noise_i-3 for all I/O user setting information 1 through 3 for each group i as shown in FIG. 4, and furthermore calculating an intra-group total of the amount of SSO noise Noise_i through Noise_3 corresponding to all groups G_1 through G_3.

As for grouping method, for example, any grouping other than the case shown in FIG. 1 can be performed by more precisely determining the distance from the pin to be processed. Therefore, in FIGS. 2, 4, etc., G_1, G_1+G_2, G1+G_2+G_3 are expressed.

The SSO noise basic characteristic data shown in FIG. 2 or 4 is based on actually measuring and acquiring the amount of SSO noise using a standard evaluation board. However, the SSO noise basic characteristic depends on the PCE (printed circuit board) loaded with an FPGA. Therefore, to correctly is estimating the amount of SSO noise, not only the characteristic of the FPGA, but also an analysis model including a PCB loaded with an FPGA is to be considered. Since a PCB loaded with an FPGA is unique for each design, it is practically impossible to obtain it by actual measurement. Therefore, there are different conditions (number of layers, via length, wiring pattern, etc.) for the evaluation board for acquiring SSO noise basic characteristic data and the PCB of an actual device, and the SSO noise basic characteristics fluctuate. As a result, there arises an error in the calculated amount of noise.

Thus, according to the embodiments of the present invention, a rough analysis is made using the SSO noise basic characteristic data measured by the conventional standard evaluation board as shown in FIG. 5, and after the designing process is performed and the parameter of the PCB is determined, the SSO noise basic characteristic data is acquired under the actual device PCB condition by the general-purpose circuit analytic simulator software, and the detailed analysis of the amount of SSO noise for a semiconductor pin is performed using the newly acquired SSO noise basic characteristic data.

Configuration of the Embodiments of the Present Invention

Described below is the configuration of an embodiment of the present invention on the basis of the above-mentioned basic principle.

In the embodiment of the present invention, the pin arrangement of the FPGA configuring an LST (large scale integrated circuit) can be determined by estimating the amount of SSO noise while keeping the pin arrangement in cooperation with the design of the PCB to be loaded with the pin arrangement.

Figure 6:
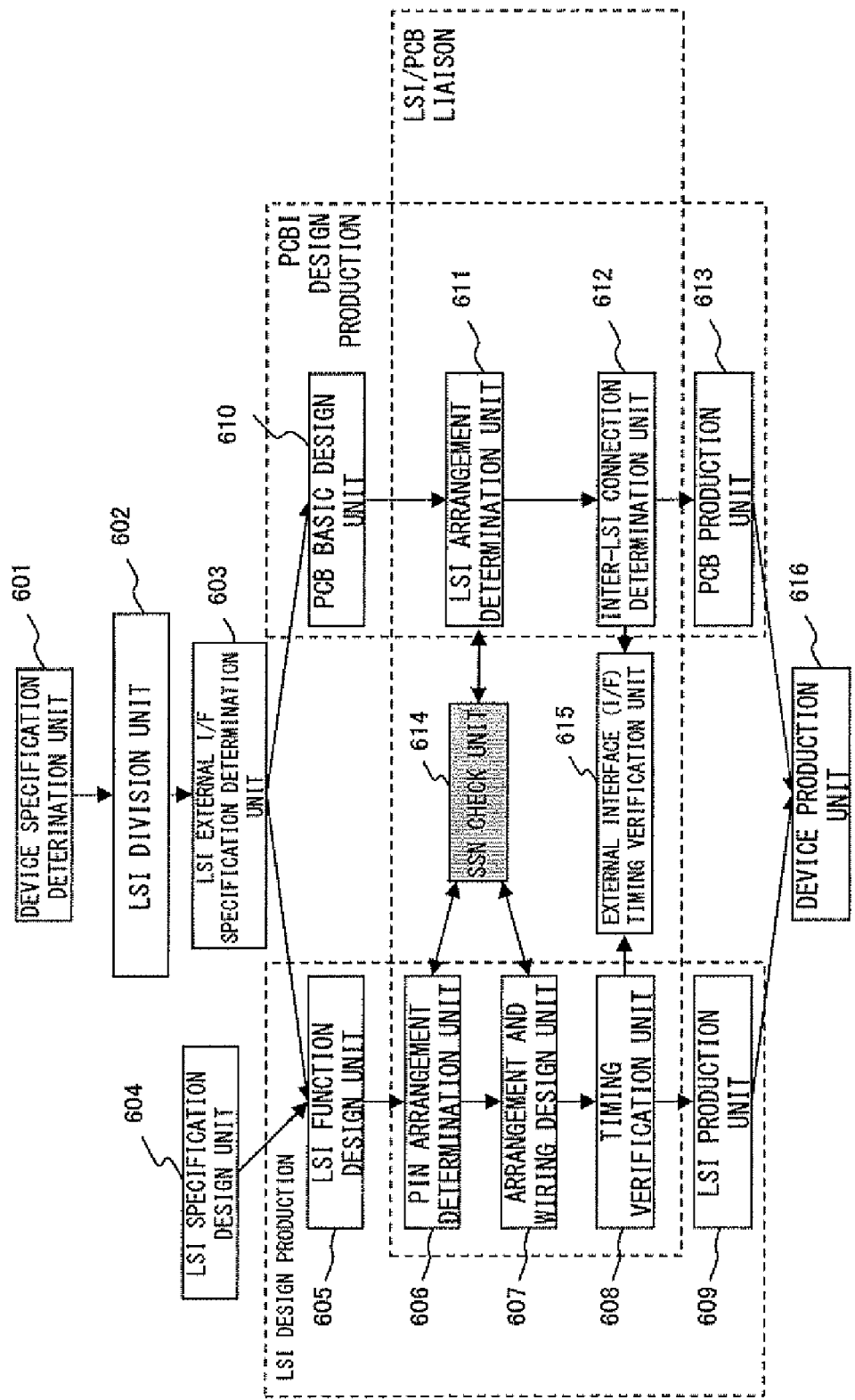
FIG. 6 is a block diagram showing the entire embodiment of the present invention having the function of designing and producing the device configured by the LSI by the FPGA and the PCB loaded with the LSI.

FIG. 6 is a block diagram showing the entire embodiment of the present invention having the function of designing and producing the device configured by the LSI (FPGA) and the PCB loaded with the LSI.

First, a device specification determination unit 601 determines the entire specification of the device (product) configured by the FPGA configuring the LSI and the PCB loaded with the FPGA.

Next, an LSI division unit 602 determines a necessary LSI function on the basis of the determined specification, and performs mapping to determine into which the LSI is to be loaded, the FPGA side or the PCB side.

Then, an LSI external interface (I/F) specification determination unit 603 determines the interface specification between the FPGA and the PCB, and between the PCB and external connection equipment.

Afterwards, each of the semiconductor device and the PCB is designed.

Each function unit designated by 604 through 609 are function block for designing an LSI by an FPGA.

First, an LSI specification design unit 604 designs a basic specification of the LSI configured by the FPGA.

Next, an LSI function design unit 605 designs the function of the LSI reflecting the design result on each function unit of the device specification determination unit 601 and LSI division unit 602.

Afterwards, the pin arrangement determination unit 606 determines the pin arrangement of the FPGA configuring the LSI, designs the wiring with the pin arrangement determined by a arrangement and wiring design unit 607, and a timing verification unit 608 verifies the timing for confirmation as to whether or not the LSI appropriately functions with the pin arrangement and wiring.

When the result of the timing verification is OK, an LSI production unit 609 produces an LSI by the FPGA.

On the other hand, each of the function units indicated by 610 through 613 is a function block for designing a PCB.

First, a PCB basic design unit 610 performs basic design for the size, type, etc. of a PCB by reflecting the design result by each of the device specification determination unit 601 and the LSI division unit 602.

Next, an LSI arrangement determination unit 611 determines the arrangement (of a connector and a power supply circuit) of the LSI to be loaded into the PCB.

Furthermore, an inter-LSI connection determination unit 612 determines the connection between LSIs in the determined LSI arrangement.

If the LSI arrangement and the wiring between the LSIs are verified as a result of checking the amount of SSO noise by the SSN check unit 614, and checking the external interface timing by an external interface (I/F) timing verification unit 615, a PCB production unit 613 executes the production of the PCB.

When the production of the LSI by the LSI production unit 609 and the production of the PCB by the PCE production unit 613 are completed, a device production unit 616 assembles a final product device from the LSIs and the PCBs.

The amount of SSO noise in the product device may be changed by the pin arrangement of the FPGA configuring the LSI, the wiring on the basis of the pin arrangement, and the arrangement of the LSI in the PCB. Therefore, as a portion specifically related to the present invention, when the pin arrangement about the LSI and the wiring design based on the arrangement are performed by the pin arrangement determination unit 606 and the arrangement and wiring design unit 607 and the LSI arrangement is designed on the PCB by the LSI arrangement determination unit 611, the SSN check unit 614 checks on all pins of the FPGA configuring each LSI whether or not the estimating process on the SSO noise has been performed and the amount of SSO noise falls within an allowable range.

If a pin on which the SSO noise out of the allowable range is generated is clearly detected, the pin arrangement about the LSI and the wiring design based on the arrangement are performed by the pin arrangement determination unit 606 and the arrangement and wiring design unit 607, or the LSI arrangement, the arrangement of the power supply circuit, or a numerical change is re-designed on the PCB by the LSI arrangement determination unit 611.

Figure 7:
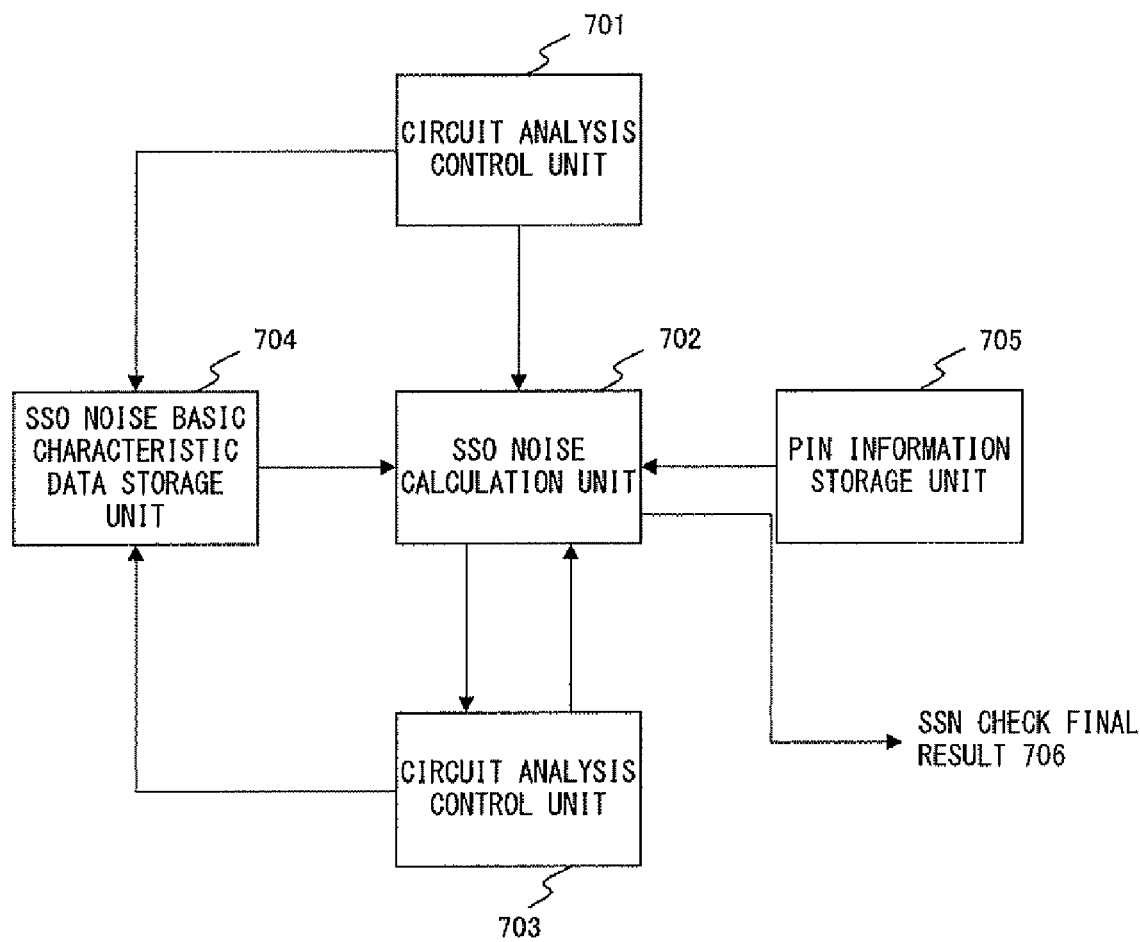
FIG. 7 is a block diagram of the SSN check unit having the function of estimating the amount of SSO noise according to an embodiment of the present invention.

FIG. 7 is a block diagram of the configuration of the SSN check unit 614 shown in FIG. 6 as an embodiment of the present invention.

As described above in the "basic principle of the embodiment of the present invention", a rough analysis is performed using the SSO noise basic characteristic data actually measured on the conventional standard evaluation board in the initial stage of the device designing in the embodiment of the present invention. When the designing proceeds and a parameter of the PCB is determined, the SSO noise basic characteristic data is acquired under the actual device PCB condition by the general-purpose circuit analytic simulator software, and a detailed analysis is performed on the amount of SSO noise for a semiconductor pin using the newly acquired SSO noise basic characteristic data.

First, a circuit analysis control unit 701 on the evaluation board controls an SSO noise basic characteristic data storage unit 704 to store the SSO noise basic characteristic data actually measured on the standard evaluation board Then, a SSO noise calculation unit 702 calculates the amount of SSO noise on the basis of the arrangement information about each pin stored in a pin information storage unit 705 and the I/O user setting information, and the SSO noise basic characteristic data obtained on the basis of the evaluation board stored in the SSO noise basic characteristic data storage unit 704. The details of the operation of this portion are described later, but the operation is performed on the basis of the abovementioned basic principle.

When the check result by the SSO noise calculation unit 702 is OK, the actual device design of the PCB is temporarily determined after the operation by the LSI arrangement determination unit 611 and the inter-LSI connection determination unit 612 described above.

Thus, the circuit analysis control unit 703 in the actual device PCB shown in FIG. 7 executes the general purpose circuit analytic simulator software (not shown in the attached drawings) according to the determined actual device PCB design information, thereby acquiring the SSO noise basic characteristic data corresponding to the actual device PCB, and correcting the SSO noise basic characteristic data stored in the SSO noise basic characteristic data storage unit 704.

Then, the SSO noise calculation unit 702 performs again the process of calculating the amount of SSO noise on the basis of the arrangement information about each pin stored in the pin information storage unit 705, the I/O user setting information, and the SSO noise basic characteristic data corrected on the basis of the actual device PCB stored in the SSO noise basic characteristic data storage unit 704.

When an SSN check final result 706 obtained as a result of the process determines the pin arrangement about the LSI and the wiring design based on the arrangement by the pin arrangement determination unit 606 and the arrangement and wiring design unit 607, and the design of the LSI arrangement on the PCB by the LSI arrangement determination unit 611.

Thus, according to the embodiment of the present invention, the amount of SSO noise is estimated on the basis of the SSO noise basic characteristic data closer to the actual design. Therefore, a device configured by the LSI of the pin arrangement determined on the basis of the estimation and the PCB implemented with the LSI can be correctly prevented from malfunctioning due to the SSO noise.

Operation According to the Embodiment of the Present Invention

Described below is the operation according to the embodiment of the present invention with the above-mentioned configuration.

FIG. 8 shows an example of the data structure of the pin information storage unit 705 shown in FIG. 7.

For each pin of each LSI configured by the FPGA, identifier information for identifying an LSI and a pin, the information about a row position and a column position on the LSI of a pin, and the I/O user setting information applied to the pin are stored.

Thus, the grouping as shown in FIG. 1 and the correspondence between a pin in any group and I/O user setting information as shown in FIG. 3 can be designated for each pin to be processed on each LSI.

FIG. 9 shows an example of the data structure of the SSO noise basic characteristic data storage unit 704 shown in FIG. 7.

The number of simultaneous switching signals (any of 1, 8, 24, and 48) and the corresponding amount of SSO noise (in milli-volt (mV) unit) are stored for each the I/O user setting information. They correspond to each number of simultaneous switching signals of the horizontal axis shown in FIGS. 2 and 4 and the amount of SSO noise such as actual Noise_1_1, actual Noise_2_1, . . . , etc. of each value. In FIG. 9, the column "suffix (reference)" shows the relationship with FIG. 2.

In FIG. 9, the amount of SSO noise is stored in each of the case where the pin for which the I/O user setting information is operated as a pin on the ground side (GND side) and the case where it is operated as a pin on the power supply side (VCC side).

In FIGS. 2 and 4, the amount of SSO noise when the number of simultaneous switching signals 1, that is, when the pin to be processed is operated alone, is zero. However, since there is actually low noise, the amount of SSO noise when the number of SSO is 1 is stored as shown in FIG. 9.

The function table data shown in FIG. 9 and stored in the SSO noise basic characteristic data storage unit 704 shown in FIG. 7 represents the SSO noise basic characteristic shown in FIGS. 2 and 4.

Figure 10:
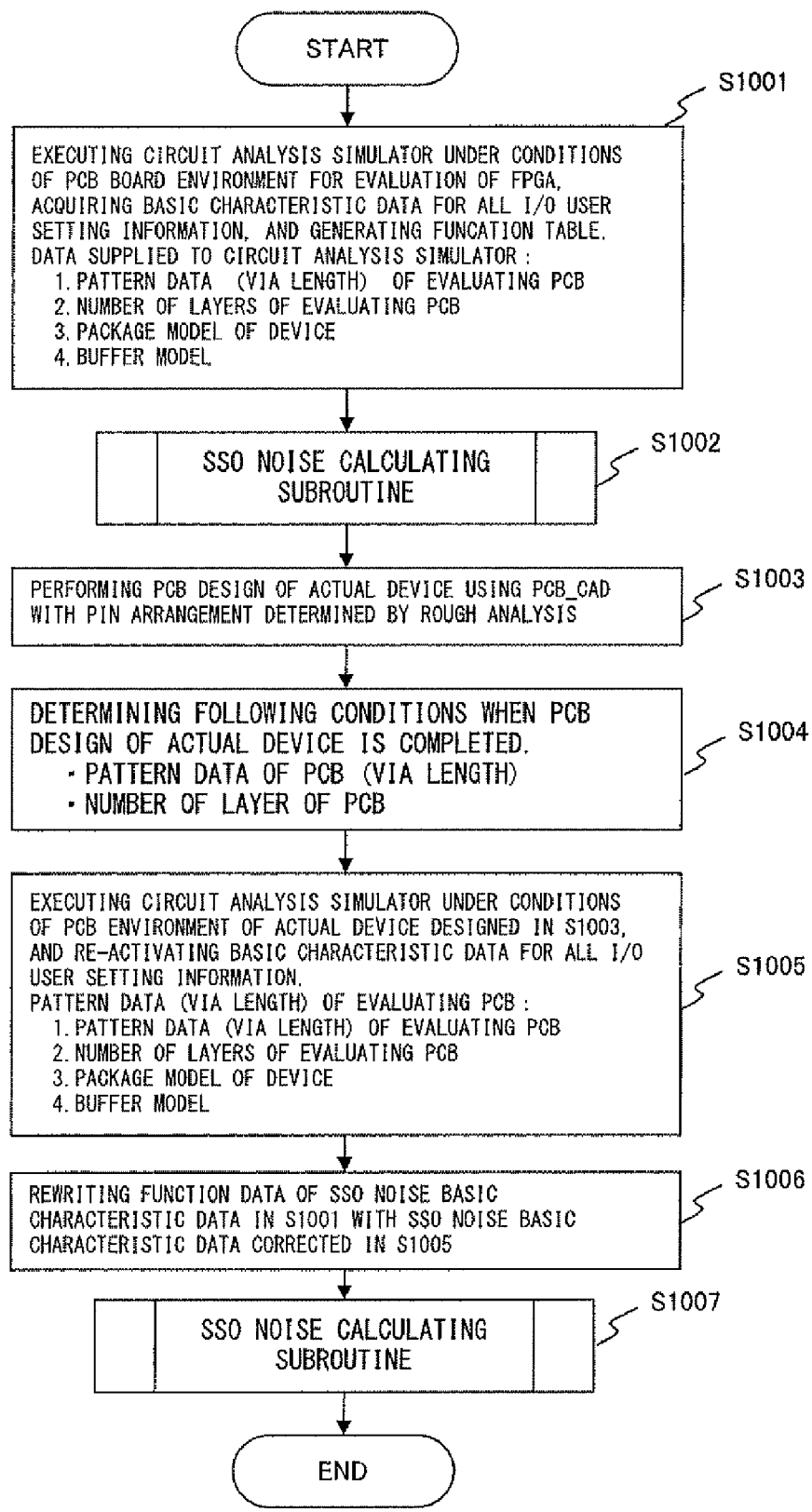
FIG. 10 is a flowchart showing the entire operation of the SSO noise calculating process☐

FIG. 10 is a flowchart of the operation of the SSN check unit 614 shown in FIG. 6 having the configuration of the functions shown in FIG. 7.

First, the process in step S1001 shown in FIG. 10 is performed by the circuit analysis control unit 701 on the evaluation board shown in FIG. 7. In this step, the general-purpose circuit analytic simulator software is executed under the condition of the PCB environment for the FPGA evaluation, the SSO noise basic characteristic data is acquired for all I/O user setting information, and its function table data is generated. As the software, the SPICE (simulation program with integrated circuit emphasis) developed by an integrated circuit group of the Electronics Research Laboratory and the Department of Electrical Engineering Computer Science (EECS) of University of California, Barkley, or the HSPICE (by Synopsys) can be used. At this time, a parameter supplied to the circuit analysis simulator can be any of the following.

1. Pattern data of PCB for evaluation (via length)
2. Number of layers of PCB for evaluation
3. Package model of device
4. Buffer model As a result of the operation above, each value of the amount of SSO noise shown in FIG. 9 is obtained, and stored in the form of function table data shown in FIG. 9 in the SSO noise basic characteristic data storage unit 704.

Figure 11:
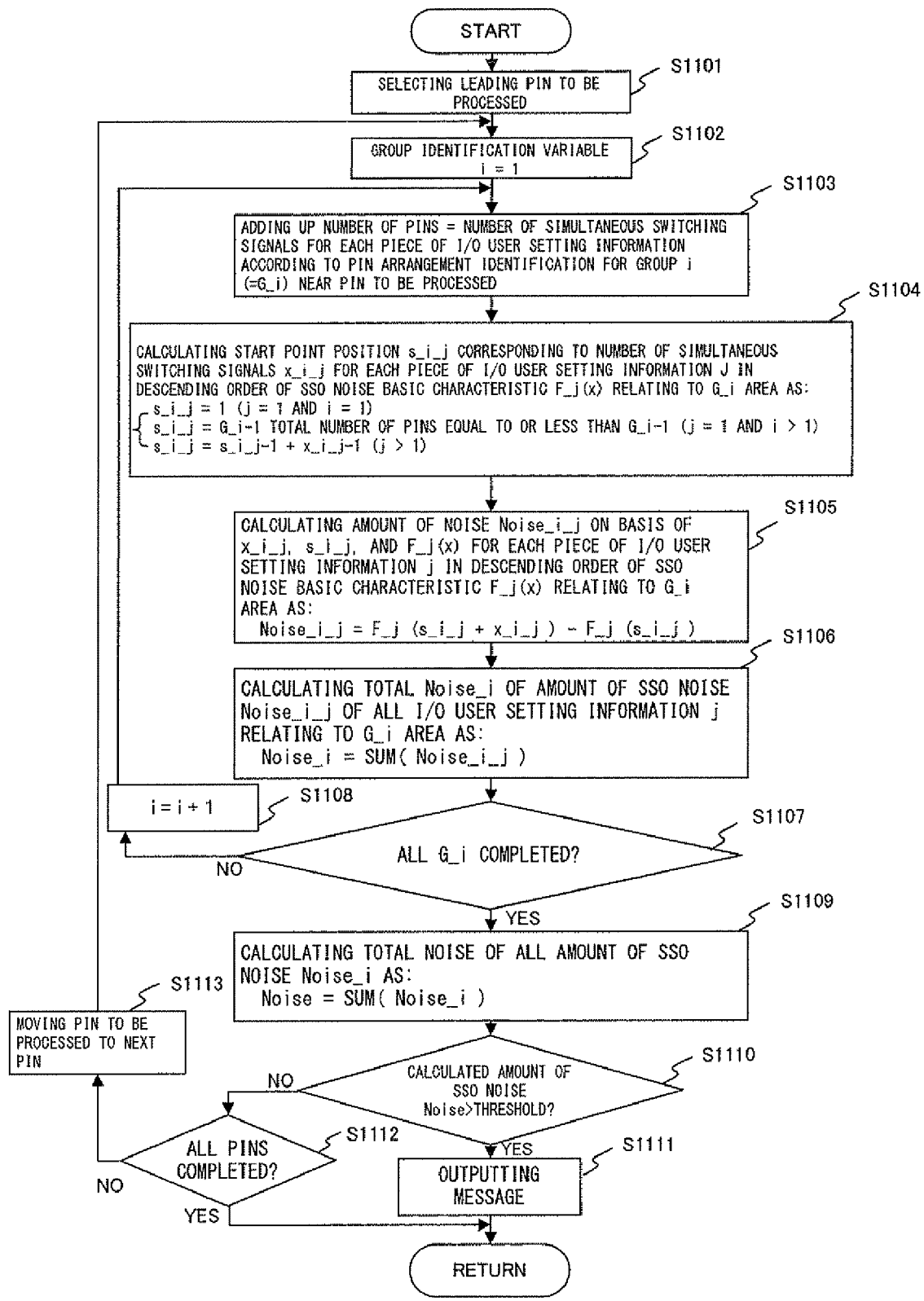
FIG. 11 is a flowchart of the operation of the SSO noise calculating subroutine.

Next, the SSO noise calculating subroutine in step 1002 shown in FIG. 10 is shown further in detail by the operation flowchart in FIG. 11, and executed by the SSO noise calculation unit 702 shown in FIG. 7.

In the operation flowchart shown in FIG. 11, the leasing pin of an LSI stored in the pin information storage unit 705 is selected as a pin to be processed (step S1101).

Next, the value of the variable i indicating a group number is set to 1 (according to S1102).

Then, the number of pins for each of the I/O user setting information A, B, and C is counted for eight pins belonging to the area (102 shown in FIG. 1) of the group i (=G_i)=group 1 (=G_1) while determining the row position and the column position of each pin of the LSI to be processed and stored in the pin information storage unit 705 (step S1103) (refer to FIG. 3).

For example, relating to the G_i area, the number of pins of the I/O user setting information A=2, the number of pins of the I/O user setting information B=4, and the number of pins of the I/O user setting information C=2 can be calculated (refer to the G_1 area shown in FIG. 3).

Next, relating to the G_i=G_1 (group 1) area, the start point position s_i_j corresponding to the number of simultaneous switching signals x_i_j is determined by the following equation 1 for each I/O user setting information j in the descending order of the SSO noise basic characteristic $F\_j(x)$ (step S1104).

$$s\_i\_j = 1 \quad \text{[equation 1]}$$

$$\square j = l \text{ and } i = 1\square$$

total number of pins equal to or less than s_i_j =

$$G\_i\square = 8, 24, \text{ or } 48\square$$

$$\square j = 1 \text{ and } i > 1\square$$

$$s\_i\_j = s\_i\_j - 1 + x\_i\_j - 1$$

$$\square j > 1\square$$

In the case of the example shown in FIGS. 2 through 4, and 9, the SSO noise basic characteristic for each piece of I/O user setting information is expressed as follows with i=1

I/O user setting information A>I/O user setting information B>I/O user setting information C Therefore, the following calculation is performed.

I/O user setting information 1□I/O user setting information A,x_1_1=2

I/O user setting information 2□I/O user setting information B,x_1_2=4

I/O user setting information 3□I/O user setting information c,x_1_3=2

As a result, the start point position is calculated by the equation 1 as follows.

$$s\_1\_1 = 1$$

$$s\_1\_2 = s\_1\_1 + x\_1\_1 = 1 + 2 = 3$$

$$s\_1\_3 = s\_1\_2 + x\_1\_2 = s\_1\_1 + x\_1\_1 + x\_1\_2 = 1 + 2 + 4 = 7$$

Next, relating to the G_i=G_1 (group 1) area, the amount of noise Noise_i_j is calculated by the following equation 2 for each I/O user setting information j in the descending order of the SSO noise basic characteristic $F\_j(x)$ on the basis of x_i_j, s_i_j, and $F\_j(x)$ (step S1105).

$$\text{Noise}\_i\_j = F\_j(s\_i\_j + x\_i\_j) - F\_j(s\_i\_j) \quad \text{[equation 2]}$$

In the example shown in FIGS. 2 through 4, and 9,

I/O user setting information 1□x_1_1=2□s_1_1=1

I/O user setting information 2□x_1_2=4□s_1_2=3

I/O user setting information 3□x_1_3=2□s_1_3=7

The SSO noise basic characteristic $F\_j(x)$, that is, $F\_1(x)$, $F\_2(x)$, and $F\_3(x)$, can be calculated as a simple line function obtained by performing linear interpolation on the amount of SSO noise in the number of simultaneous switching signals (number of SSO)=1 on the function table (GND side) shown in FIG. 9 and the amount of SSO noise in the number of SSO=8 for each of the I/O user setting information 1 (=A), the I/O user setting information 2 (=B), and the I/O user setting information 3 (=C) in the G_i=G_1 area as shown in FIGS. 2 and 4, and can be calculated as follows.

$$F\_1(x) = \{(380 - 50)/(8 - 1)\}x + \{(8*50 - 1*380)/(8 - 1)\}$$
$$= 47.143*x + 2.857$$

$$F\_2(x) = \{(305 - 40)/(8 - 1)\}x + \{(8*40 - 1*305)/(8 - 1)\}$$
$$= 37.857*x + 2.143$$

$$F\_3(x) = \{(214 - 30)/(8 - 1)\}x + \{(8*30 - 1*214)/(8 - 1)\}$$
$$= 26.286*x + 3.714$$

Thus, the amount of SSO noise Noise_1_1, Noise_1_2, and Noise_1_3 in each of the I/O user setting information 1 (=A), the I/O user setting information 2 (=B), and the I/O user setting information 3 (=C) in the G_i=G_1 area can be calculated as follows by the equation 2.

$$\text{Noise\_1\_1} = F\_1(s\_1\_1 + x\_1\_1) - F\_1(s\_1\_1)$$
$$= \{47.143*(1 + 2) + 2.857\} - (47.143*1 + 2.857)$$
$$= 47.143*2$$
$$= 94.286 \text{ (mV)}$$

-continued $$\begin{aligned}
\text{Noise\_1\_2} &= F\_2(s\_1\_2 + x\_1\_2) - F\_2(s\_1\_2) \\
&= \{35.857*(3+4) + 2.143\} - (35.857*3 + 2.143) \\
&= 35.857*4 \\
&= 143.428 \text{ (mV)}
\end{aligned}$$

$$\begin{aligned}
\text{Noise\_1\_3} &= F\_3(s\_1\_3 + x\_1\_3) - F\_3(s\_1\_3) \\
&= \{26.286*(7+2) + 3.714\} - (26.286*7 + 3.714) \\
&= 26.286*2 \\
&= 52.572 \text{ (mV)}
\end{aligned}$$

As it is known from the equation 2 and FIG. 4, the amount of SSO noise Noise_i_j for each piece of I/O user setting information j in the G_i area is equal to the increment of the SSO noise basic characteristic F_j(x) for the increment of the number of simultaneous switching signals x_i_j in the G_i area for each piece of I/O user setting information j. Therefore, when the SSO noise basic characteristic F_j(x) is expressed by a simple line, the equation 2 can be simplified into the following equation 3.

$$\text{Noise\_}i\_j = a\_j * x\_i\_j \qquad \text{[equation 3]}$$

where a_j indicates the tilt of the line of the SSO noise basic characteristic in the G_i area. When the SSO noise basic characteristic F_j(x) is not expressed by a simple line, the calculation is to be precisely performed by the equation 2.

Thus, when the amount of SSO noise Noise_i_j, that is, Noise_1_1, Noise_1_2, and Noise_1_3, is calculated for each piece of the I/O user setting information j in the G_i=G_1 area, the total amount of SSO noise Noise_i=Noise_1 is calculated as the sum of them in the G_i=G_1 area (step S1106).

$$\begin{aligned}
\text{Noise\_1} &= \text{Noise\_1\_} + \text{Noise\_1\_2} + \text{Noise\_1\_3} \\
&= 94.286 + 143.428 + 52.572 \\
&= 290.03 \text{ (mV)}
\end{aligned}$$

Thus, when the process for one group area is completed, it is determined whether or not the processes have been completed on all G_i areas (step S1107).

For example, when G_i=G_1, and there are other G_2 area and G_3 area as shown in FIGS. 2 through 4 the determination in step S1107 is NO, the value of group identification variable i is incremented by 1 into i=2 (step S1108), control is returned to S1103, and the process on the G_2 area is repeatedly performed.

Relating to the G_2 area, for example, the calculated number of pins of the I/O user setting information A=5, the calculated number of pins of the I/O user setting information B=5, and the calculated number of pins of the I/O user setting information C=5 in step S1103 (refer to the G_2 area shown in FIG. 3).

Next, in step S1104, relating to the G_2 area, i=2, and the SSO noise basic characteristic for each piece of the I/O user setting information is represented as follows in the example shown in FIGS. 2 through 4 and 9.

I/O user setting information A>I/O user setting information B>
I/O user setting information C
Therefore, the following calculation is performed.

I/O user setting information 1□I/O user setting information A,x__2__1=5

I/O user setting information 2□I/O user setting information B,x__2__2=5

I/O user setting information 3□I/O user setting information C,x__2__3=5

As a result, the start point position is calculated as follows by the equation 1.

number of pins of s__2__1=G__1=8

$$s\_2\_2 = s\_2\_1 + x\_2\_1 = 8 + 5 = 13$$

$$s\_2\_3 = s\_2\_2 + x\_2\_2 = s\_2\_1 + x\_2\_1 + x\_2\_2 = 8 + 5 + 5 = 18$$

Next, in step 1105, the SSO noise basic characteristic F_j (x), that is, F__1(x), F__2(x), and F__3(x), can be calculated as a simple line function obtained by performing linear interpolation on the amount of SSO noise with the number of simultaneous switching signals (number of SSO)=8 on the function table (GND side) shown in FIG. 9 and the amount of SSO noise with the number of SSO=24 for each of the I/O user setting information 1 (=A), the I/O user setting information 2 (=B), and the I/O user setting information 3 (=C) in the G_i=G_2 area as shown in FIG. 2 or 4, and can be calculated as follows.

$$F\_1(x) = \{(990-380)/(24-8)\}x + \{(24*380-8*990)/(24-8)\} = 38.125*x + 0.072$$

$$F\_2(x) = \{(786-305)/(24-8)\}x + \{(24*305-8*786)/(24-8)\} = 30.063*x + 0.073$$

$$F\_3(x) = \{(524-214)/(24-8)\}x + \{(24*214-8*524)/(24-8)\} = 19.375*x + 0.077$$

Thus, the amount of SSO noise Noise_2_1, Noise_2_2, and Noise_2_3 in each of the I/O user setting information 1 (=A), the I/O user setting information 2 (=B), and the I/O user setting information 3 (=C) in the G_i=G_2 area is calculated by the equation 2 as follows.

$$\begin{aligned}
\text{Noise\_2\_1} &= F\_1(s\_2\_1 + x\_2\_1) - F\_2(s\_2\_1) \\
&= 38.125*5 \\
&= 190.625 \text{ (mV)}
\end{aligned}$$

$$\begin{aligned}
\text{Noise\_2\_2} &= F\_2(s\_2\_2 + x\_2\_2) - F\_2(s\_2\_2) \\
&= 30.063*5 \\
&= 150.315 \text{ (mV)}
\end{aligned}$$

$$\begin{aligned}
\text{Noise\_2\_3} &= F\_3(s\_2\_3 + x\_2\_3) - F\_3(s\_2\_3) \\
&= 19.375*5 \\
&= 96.875 \text{ (mV)}
\end{aligned}$$

Thus, the amount of SSO noise Noise_i_j for each piece of I/O user setting information j in the G_i=G_2 area, that is, Noise_2_1, Noise_2_2, and Noise_2_3, can be calculated, a total amount of SSO noise Noise_i=Noise_2 in the G_i=G_2 area is calculated as the sum (step S1106).

$$\begin{aligned}
\text{Noise\_2} &= \text{Noise\_2\_1} + \text{Noise\_2\_2} + \text{Noise\_2\_3} \\
&= 190.625 + 150.315 + 96.875 \\
&= 437.82 \text{ (mV)}
\end{aligned}$$

As described above, when the process for the G_2 area is completed, there is still the process to be performed on the G_3 area. Therefore, the determination in step S1107 is NO, the value of the group identification variable i is incremented by 1 into i=3 (step S1108), control is returned to S1103, and the process on the G_3 area is repeatedly performed.

Relating to the G_3 area, for example, the calculated number of pins of the I/O user setting information A=7, the calculated number of pins of the I/O user setting information B=7, and the calculated number of pins of the I/O user setting information C=7 in step S1103 (refer to the G_3 area shown in FIG. 3).

Next, in step S1104, relating to the G_3 area, i=3, and the SSO noise basic characteristic for each piece of the I/O user setting information is represented as follows in the example shown in FIGS. 2 through 4 and 9.

I/O user setting information A>I/O user setting information B>
I/O user setting information C
Therefore, the following calculation is performed.

I/O user setting information 1☐I/O user setting information A,x__3__1=7

I/O user setting information 2☐I/O user setting information B,x__3__2=7

I/O user setting information 3☐I/O user setting information C,x__3__3=7

As a result, the start point position is calculated as follows by the equation 1.

total number of pins equal to or lower than $s\_3\_1 = G\_2 = 8+16 = 24$ $s\_3\_2 = s\_3\_1 + x\_3\_1 = 24+7 = 31$ $s\_3\_3 = s\_3\_2 + x\_3\_2 = s\_3\_1 + x\_3\_1 + x\_3\_2 = 24+7+7 = 38$ Next, in step 1105, the SSO noise basic characteristic F_j (x), that is, F__1(x), F__2(x), and F__3(x), can be calculated as a simple line function obtained by performing linear interpolation on the amount of SSO noise with the number of simultaneous switching signals (number of SSO)=24 on the function table (GND side) shown in FIG. 9 and the amount of SSO noise with the number of SSO=48 for each of the I/O user setting information 1 (=A), the I/O user setting information 2 (=B), and the I/O user setting information 3 (=C) in the G_i=G_3 area as shown in FIG. 2 or 4, and can be calculated as follows.

$$F\_1(x) = \{(1455 - 990)/(48 - 24)\}x + \{(48*990 - 24*1455)/(48 - 24)\}$$
$$= 19.375*x + 0.057$$

$$F\_2(x) = \{(1245 - 786)/(48 - 24)\}x + \{(48*786 - 24*1245)/(48 - 24)\}$$
$$= 19.125*x + 0.053$$

$$F\_3(x) = \{(853 - 524)/(48 - 24)\}x + \{(48*524 - 24*853)/(48 - 24)\}$$
$$= 13.708*x + 0.051$$

Thus, the amount of SSO noise Noise_3_1, Noise_3_2, and Noise_3_3 in each of the I/O user setting information 1 (=A), the I/O user setting information 2 (=B), and the I/O user setting information 3 (=C) in the G_i=G_3 area is calculated by the equation 2 as follows.

$$\text{Noise\_3\_1} = F\_1(s\_3\_1 + x\_3\_1) - F\_2(s\_3\_1)$$
$$= 19.375*7$$
$$= 135.625 \text{ (mV)}$$

$$\text{Noise\_2\_2} = F\_2(s\_3\_2 + x\_3\_2) - F\_2(s\_3\_2)$$
$$= 19.125*7$$
$$= 133.875 \text{ (mV)}$$

$$\text{Noise\_2\_3} = F\_3(s\_3\_3 + x\_3\_3) - F\_3(s\_3\_3)$$
$$= 13.708*7$$
$$= 95.956 \text{ (mV)}$$

Thus, the amount of SSO noise Noise_i_j for each piece of I/O user setting information j in the G_i=G_3 area, that is, Noise_3_1, Noise_3_2, and Noise_3_3, can be calculated, a total amount of SSO noise Noise_i=Noise_2 in the G_i=G_3 area is calculated as the sum (step S1106).

$$\text{Noise\_3} = \text{Noise\_3\_1} + \text{Noise\_3\_2} + \text{Noise\_3\_3}$$
$$= 135.625 + 133.875 + 95.956$$
$$= 365.46 \text{ (mV)}$$

As described above, when the process for the G_3 area is completed, the determination in step S1107 is YES because the entire process in all group areas is completed. By calculating the sum of the amount of SSO noise Noise_i, the final Noise is calculated.

$$\text{Noise} = \text{Noise\_1} + \text{Noise\_2} + \text{Noise\_3}$$
$$= 290.03 + 437.82 + 365.46$$
$$= 1093.31 \text{ (mV)}$$

When the total amount of SSO noise Noise is calculated for all groups, it is determined whether or not it is larger than a predetermined allowable threshold (step S1110).

If the total amount of SSO noise Noise is larger than the allowable threshold, and the determination in step S1110 is YES, then a message to prompt a design alteration is output to a display device, a printer device, or a log file, etc. not specifically shown in the attached drawings, thereby terminating the SSO noise calculating subroutine in step S1002 shown in FIG. 10.

On the other hand, if the total amount of SSO noise Noise is equal to or less than the allowable threshold, and the determination in step S1110 is NO, then it is determined whether or not the process performed on all pins as pins to be processed on one LSI has been completed (step S1112).

If the process on all pins has not been completed, a pin after the processed pins on one LSI as stored in the pin information storage unit 705 is selected as a new pin to be processed (step S1101).

Afterwards, similarly the process of the amount of SSO noise on the pin to be processed is performed, and it is determined whether or not the resultant total amount of SSO noise is larger than the allowable threshold. In these processes, is any pin is determined that is is larger than the allowable threshold, the process in step S1111 is performed, and a message to prompt a design alteration is output.

When the process is completed on all pins to be processed, and the determination in step S1112 is YES, the process in step S1002 is normally terminated, and the next process in step S1003 is performed.

The series of processes above are practically performed repeatedly on all LSIs stored in the pin information storage unit 705, and all LSIs are checked.

In the example of the function table shown in FIG. 9, since the amount of SSO noise is stored with the pin for which each piece of I/O user setting information is set functioning as a pin on the ground side (GND side) and with the pin functioning as a pin on the power supply side (VCC side), the similar processes are repeatedly performed on the I/O user setting information on the ground side and the power supply side.

The SSO noise calculating subroutine in step S1002 shown in FIG. 10 and described in detail above is a process to perform a rough analysis on the amount of SSO noise using SSO noise basic characteristic data about the PCB for evaluation that is stored in the form of function table data shown in FIG. 9 in the SSO noise basic characteristic data storage unit 704 shown in FIG. 7 by the circuit analysis control unit 701 in the evaluation board shown in FIG. 7 in step S1001.

When the process in the subroutine is OK, the actual device design of a PCB is temporarily determined after the above-mentioned operation by the LSI arrangement determination unit 611 and the inter-LSI connection determination unit 612 shown in FIG. 6 (step S1003 shown in FIG. 10).

At this time, the following conditions are determined (step 1004 shown in FIG. 10).

Pattern data of PCB (via length)
Number of layers of PCB

Under the conditions, the step 1005 shown in FIG. 10 is performed by the circuit analysis control unit 703 in the actual device PCB shown in FIG. 7. In this step, under the determined environment conditions of the actual device PCB, the general-purpose circuit analytic simulator software (SPICE, JSPICE, etc.) is executed, the SSO noise basic characteristic data is acquired on all I/O user setting information, and the function table data is generated. At this time, the following parameters are used as parameters applied to the firmware analytic simulator.

1. Pattern data of actual device PCB (via length)
2. Number of layers of actual device PCB
3. Package model of device
4. Buffer model As a result of the operation above, each corrected value of the amount of SSO noise shown in FIG. 9 is acquired, and on the basis of the corrected values, the contents of the format of the function table data shown in FIG. 9 stored in the SSO noise basic characteristic data storage unit 704 is rewritten (step S1006).

As described above, using the SSO noise basic characteristic data obtained in the state close to the implemented state, the SSO noise calculating subroutine in step S1007 shown in FIG. 10 is executed again by the SSO noise calculation unit 702 shown in FIG. 7. The operation is the same as the operation flowchart shown in FIG. 11. The difference from step S1002 is the SSO noise basic characteristic data with the corrected contents.

Thus, after the rough analysis on the amount of SSO noise, the SSO noise basic characteristic data is corrected on the basis of the actual design simulation of a PCB, and the detailed analysis is further performed on the amount of SSO noise, thereby performing high precision estimation.

Figure 12:
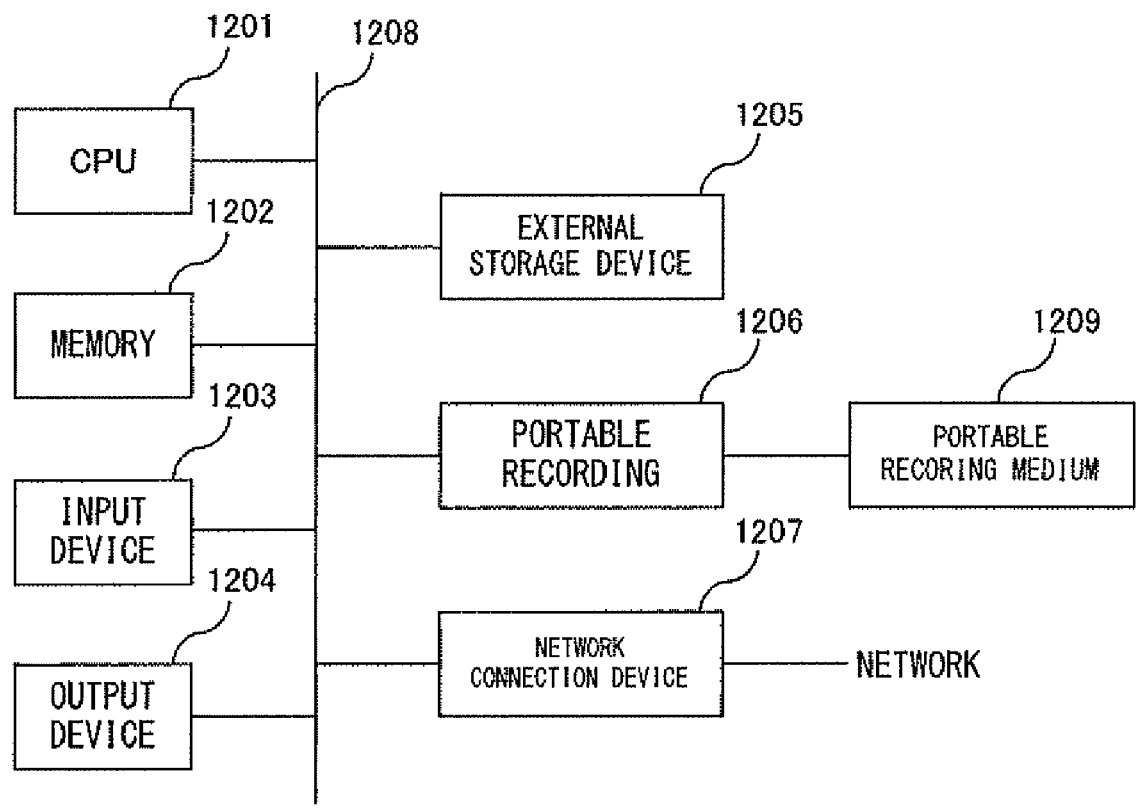
FIG. 12 shows an example of the configuration of the hardware of a computer capable of realizing an embodiments of the present invention.

Configuration when the Embodiment of the Present Invention is Realized as a Computer Program FIG. 12 shows an example of the configuration of hardware of a computer when the device according to the above-mentioned embodiment of the present invention can be realized.

The computer shown in FIG. 12 includes a CPU 1201, memory 1202, an input device 1203, an output device 1204, an external storage device 1205, a portable recording medium drive device 1206 into which a portable recording medium 1209 is inserted, and a network connection device 1207. These components are interconnected via a bus 1208. The configuration shown in FIG. 12 is an example of a computer capable of realizing the above-mentioned system, and the present invention is not limited to this configuration.

The CPU 1201 controls the entire computer. The memory 1202 is RAM etc. for temporarily storing a program or data stored in the external storage device 1205 (or the portable recording medium 1209) when the program is executed, data is updated, etc. The CPU 1201 controls the entire system by reading the program to the memory 1202 and executing the program.

The input device 1203 is configured by, for example, a keyboard, a mouse, etc. and an interface control device for them. The input device 1203 detects input by a user using the keyboard, the mouse, etc., and reports the detection result to the CPU 1201.

The output device 1204 includes a display device, a printer device, etc. and an interface control device for them. The output device 1204 outputs the data transmitted by the control of the CPU 1201 to the display device and the printer device.

The external storage device 1205 is, for example, a hard disk storage device, and is used mainly in storing various data and programs.

The portable recording medium drive device 1206 stores a portable recording medium 1209 such as an optical disk, SDRAM, CompactFlash, etc., and functions as an ancillary to the external storage device 1205.

The network connection device 1207 is used in, for example, connecting a communication circuit of a LAN (local area network) or a WAN (wide area network).

The system according to the embodiments of the present invention is read by the CPU 1201 executing a program for realizing the necessary function described above with reference to FIGS. 5, 6, etc. The program can be stored in, for example, the external storage device 1205 and the portable recording medium 1209 and distributed, or can be acquired over a network through the network connection device 1207.

What is claimed is:

1. A simultaneous switching noise estimating apparatus including a processor for estimating simultaneous switching noise based on simultaneous operations of input/output signals of a plurality of pins that can be set according to plural pieces of user setting information in a semiconductor device, comprising:

a first unit which calculates simultaneous switching noise basic characteristic data indicating for each piece of user setting information a function relationship between a number of simultaneous switching signals as a number of simultaneously operating pins and an amount of simultaneous switching noise when the semiconductor device is loaded into a predetermined standard or evaluation printed circuit board;

a second unit which calculates a number of simultaneous switching signals for each piece of user setting information about an area near each pin to be processed using each pin of the semiconductor device as a pin to be processed;

a third unit which calculates an amount of simultaneous switching noise for each pin to be processed on the basis of the calculation result of the second unit and the simultaneous switching noise basic characteristic data calculated in the first unit;

a fourth unit which calculates and corrects simultaneous switching noise basic characteristic data when a pin arrangement of a semiconductor device and a configuration of a printed circuit board into which the semiconductor device are provided are designed so that the amount of simultaneous switching noise for each pin to be processed calculated in the third unit can be within a predetermined allowable range;

a fifth unit which calculates a number of simultaneous switching signals for each piece of user setting information on an area near each pin to be processed using each pin of the semiconductor device as a pin to be processed;

a sixth unit which re-calculates an amount of simultaneous switching noise for each pin to be processed on a basis of a calculation result of the fifth unit and the simultaneous switching noise basic characteristic data corrected in the fourth unit; and a seventh unit which corrects design of the configuration of the printed circuit board for which the pin arrangement of the semiconductor device is performed and the semiconductor device is loaded so that the amount of simultaneous switching noise for each pin to be processed re-calculated in the sixth unit can be within a predetermined allowable range;

wherein the first through seventh units are implemented by the processor.

2. The apparatus according to claim 1, wherein:

in the second or fifth unit, the area near each pin to be processed is divided into a plurality of groups on a basis of a distance from each pin to be processed, the number of simultaneous switching signals is calculated for each group according to each piece of user setting information, the amount of simultaneous switching noise is calculated on the basis of the result of calculating the number of simultaneous switching signals and the simultaneous switching noise basic characteristic data, results of the calculation of the second or fifth unit respectively are added up for all groups, and the amount of simultaneous switching noise for each pin to be processed is calculated; and the simultaneous switching noise basic characteristic data indicates a function relationship between the number of simultaneous switching signals and the amount of simultaneous switching noise for each group and each piece of user setting information.

3. A computer-readable, non-transitory recording medium storing a program used to direct a computer to estimate simultaneous switching noise based on simultaneous operations of input/output signals of a plurality of pins that can be set according to plural pieces of user setting information in a semiconductor device, the estimation by the computer comprising:

first calculating simultaneous switching noise basic characteristic data indicating for each piece of user setting information a function relationship between a number of simultaneous switching signals as a number of simultaneously operating pins and an amount of simultaneous switching noise when the semiconductor device is loaded into a predetermined standard or evaluation printed circuit board;

second calculating a number of simultaneous switching signals for each piece of user setting information about an area near each pin to be processed using each pin of the semiconductor device as a pin to be processed;

third calculating an amount of simultaneous switching noise for each pin to be processed on the basis of the calculation result from the second calculating and the simultaneous switching noise basic characteristic data calculated by the first calculating;

re-calculating and correcting simultaneous switching noise basic characteristic data when a pin arrangement of a semiconductor device and a configuration of a printed circuit board into which the semiconductor device are provided are designed so that the amount of simultaneous switching noise for each pin to be processed calculated by the third calculating can be within a predetermined allowable range;

fourth calculating a number of simultaneous switching signals for each piece of user setting information on an area near each pin to be processed using each pin of the semiconductor device as a pin to be processed;

Further re-calculating an amount of simultaneous switching noise for each pin to be processed on a basis of a calculation result from the fourth calculating and the simultaneous switching noise basic characteristic data corrected by the re-calculating and correcting; and further correcting design of the configuration of the printed circuit board for which the pin arrangement of the semiconductor device is performed and the semiconductor device is loaded so that the amount of simultaneous switching noise for each pin to be processed re-calculated by the the further re-calculating can be within a predetermined allowable range.

4. The recording medium according to claim 3, wherein:

by the second calculating or fourth calculating, the area near each pin to be processed is divided into a plurality of groups on a basis of a distance from each pin to be processed, the number of simultaneous switching signals is calculated for each group according to each piece of user setting information, the amount of simultaneous switching noise is calculated on the basis of the result of calculating the number of simultaneous switching signals and the simultaneous switching noise basic characteristic data, results of the calculation of the second calculating or fourth calculating are added up for all groups, and the amount of simultaneous switching noise for each pin to be processed is calculated; and the simultaneous switching noise basic characteristic data indicates a function relationship between the number of simultaneous switching signals and the amount of simultaneous switching noise for each group and each piece of user setting information.

* * * * *